United States Patent [19]

Umeji

[11] Patent Number: 4,831,430
[45] Date of Patent: May 16, 1989

[54] OPTICAL SEMICONDUCTOR DEVICE AND METHOD OF MANUFACTURING THE SAME

[75] Inventor: Tadashi Umeji, Kawasaki, Japan

[73] Assignee: Kabushiki Kaisha Toshiba, Kawasaki, Japan

[21] Appl. No.: 248,285

[22] Filed: Sep. 22, 1988

Related U.S. Application Data

[63] Continuation of Ser. No. 811,685, Dec. 20, 1985, abandoned.

[30] Foreign Application Priority Data

Dec. 26, 1984 [JP] Japan .............................. 59-273415

[51] Int. Cl.$^4$ ............................................ H01L 27/04
[52] U.S. Cl. ........................................ 357/48; 357/90; 357/30
[58] Field of Search ...................... 357/48, 30 G, 30 L, 357/30 P, 90

[56] References Cited

U.S. PATENT DOCUMENTS 4,046,605  9/1977  Nelson ................................... 357/40
4,292,642  9/1981  Appels et al. ......................... 357/48
4,564,855  1/1986  Van Zenten ........................... 357/48

Primary Examiner—Martin H. Edlow
Attorney, Agent, or Firm—Finnegan, Henderson, Farabow, Garrett, & Dunner

[57] ABSTRACT

A P-type epitaxial silicon layer is formed between an N-type epitaxial layer and a P+-type semiconductor substrate. An impurity concentration profile is formed in at least one region of the P-type epitaxial silicon layer to decrease with an increase in distance from the substrate and toward the N-type epitaxial layer. A depletion layer is formed as a function region (P-N junction) between the P-type epitaxial silicon layer and the N-type epitaxial layer. Carriers are generated when light is incident on the depletion layer. Carriers are also generated in a region of the P-type layer deeper than the depletion layer. A self-electric field is formed in the P-type epitaxial silicon layer by the impurity concentration profile, which is lowest at the junction. The carriers generated in this manner are accelerated by the self-electric field and flow rapidly into the function region. As a result, an optical semiconductor device according to the present invention has good response characteristics.

10 Claims, 6 Drawing Sheets

FIG. 11
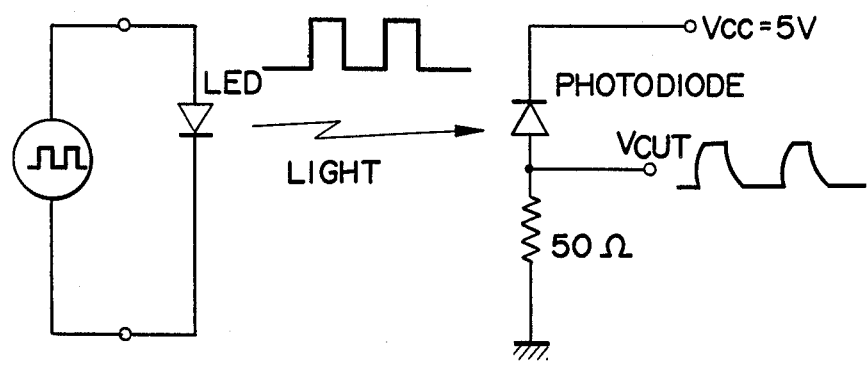
FIG. 12A — INPUT SIGNAL
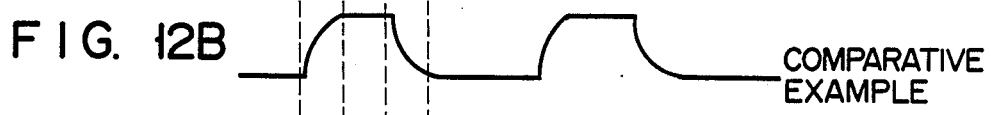
FIG. 12B — COMPARATIVE EXAMPLE
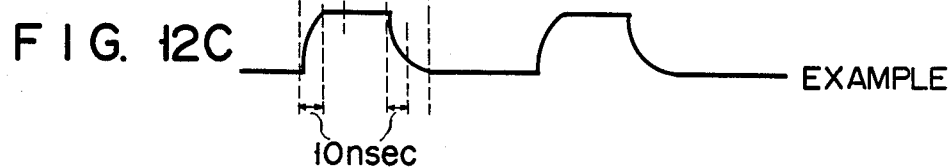
FIG. 12C — EXAMPLE

OPTICAL SEMICONDUCTOR DEVICE AND METHOD OF MANUFACTURING THE SAME

BACKGROUND OF THE INVENTION

This application is a continuation of application Ser. No. 811,685, filed Dec. 20, 1985, now abandoned.

The present invention relates to an optical semiconductor device wherein an optical semiconductor element and a peripheral circuit element such as a bipolar transistor are incorporated in the same chip and to a method of manufacturing the same.

Semiconductor light-receiving elements have significant applications as receiving circuit devices in optical communications. In a conventional optical communication receiving circuit device, a photosensitive element and a peripheral circuit are assembled on different chips (a hybrid circuit), and the chips are assembled in a package to constitute the receiving circuit device.

FIG. 1 is a sectional view of conventional semiconductor photo-sensitive element 10, FIG. 2 is a sectional view of peripheral circuit element 30, and FIG. 3 is a plan view of a receiving circuit device in which elements 10 and 30 are assembled in a package. In element 10, N$^-$-type epitaxial silicon layer 16 (having an impurity concentration of about $10^{12}$ to $10^{14}$/cm$^3$) is stacked on N$^+$-type silicon substrate 14 (having an impurity content of about $10^{13}$/cm$^3$), and silicon oxide film 22 is formed on layer 16. N$^+$-type diffusion layer 18 and P$^+$-type impurity region 20 are formed in layer 16 near film 22. Al electrode 24 is formed to make ohmic contact with region 20. Al electrode 12 is stacked under substrate 14. In element 10, the junction region between region 20 and layer 16 is reverse biased state and not conductive. Thus, when light is incident upon the junction region, the junction region is caused to be active so that a current flows across electrodes 12 and 24.

N-type epitaxial silicon layer 34 (having an impurity concentration of less than about $5 \times 10^{15}$) is stacked on P-type silicon substrate 32 (having an impurity concentration of about $10^{14}$ to $10^{16}$) in peripheral circuit element 30. Silicon oxide film 40 is formed on layer 34. N$^+$-type buried region 36 is formed between substrate 32 and layer 34. Layer 34 is isolated by P-type isolation diffusion layer 38. A plurality of elements, such as an NPN transistor having P-type base region 50 and N$^+$-type emitter region 48 and a resistor element having P$^+$-type impurity region 52 are formed in regions of layer 34 isolated by layer 38. Reference numerals 42, 44 and 46 denote aluminum electrodes.

Elements 10 and 30 are assembled on lead frame 56 and packaged in package 54 as shown in FIG. 3. Elements 10 and 30 are connected with each other through bonding wire 58 and lead frame 56. Photo current generated by element 10 is amplified by an NPN transistor in element 30 and produced as an output signal.

The hybrid receiving device described above involves high manufacturing costs. The output current generated from element 10 is as low as several hundred nA, and bonding wire 58 and lead frame 56 tend to act as an antenna. Thus, the conventional receiving device can be adversely influenced by noise: the higher the output current frequency, the lower the S/N ratio.

A technique for providing a receiving circuit on one chip for optical communication using integrated circuit (hereinafter referred to as IC) technology has been proposed. FIG. 4 shows a receiving circuit device which is different from that of FIG. 2 in that a planar photo-sensitive element is used in place of the photo-sensitive element shown in FIG. 1. Note that the parts in FIG. 4 having the same functions as those in FIGS. 1 and 2 are denoted by the same reference numerals, and descriptions thereof are omitted. In FIG. 4, the photo-sensitive element portion is on the left and the peripheral circuit element portion is on the right. Only part of an NPN transistor is shown in the peripheral circuit element portion. The photo-sensitive element portion has a planar structure so that it can be integrated with the peripheral circuit element portion on the same chip. For this reason, unlike the conventional photo-sensitive element of FIG. 1, N$^+$-type contact region 14' is formed in FIG. 4 at an interface between layer 34 and film 40, and electrode 12' is connected to region 14'. Since the impurity concentration of layer 34 is higher than that of layer 16 of FIG. 1, the breakdown voltage between layer 34 and a P$^+$-type impurity region is low. To compensate for this, deep P$^+$-type guard ring region 26 is provided to increase the breakdown voltage.

When light is incident on the photo-sensitive element portion of the optical semiconductor device as indicated by the arrow in FIG. 4, a photo current is generated, supplied to P-type base region 50 of the NPN transistor through interconnection layer 52 and 44, and produced as amplified output current.

The sensitivity of the photo-sensitive element depends on the thickness of layer 34, which serves as a depletion layer. In order to increase sensitivity the thickness of layer 34 must be increased. When light having a wavelength λ of 800 nm is incident and the thickness of layer 34 is assumed to be $t_{VG}$, the light absorption ratio ($I_O/I$) in layer 34 is expressed by the following equation (1):

$$(I_O/I) \times 100 = 1 - \exp(-\alpha \cdot t_{VG}) \qquad (1)$$

where
  $I_O$: light absorption quantity;
  I: incident light quantity; and
  α: absorption coefficient Assume that the thickness $t_{VG}$ of layer 34 is 5 μm. Since light absorption coefficient α of light having a wavelength λ=800 nm is $9.3 \times 10^2$/cm, the absorption ratio ($I_O/I$) of light having the wavelength λ=800 nm in layer 34 is found by equation (1) to be as low as 37%. The thickness of $t_{VG}$ may be increased, but it is limited by the general thickness (3 to 10 μm) of layer 34 in an NPN transistor. When the thickness is larger than that, $V_{CE}$(saturated) of the NPN transistor may be increased, or the collector resistance is increased to degrade response characteristics, thus impairing the characteristics of the peripheral circuit.

A conventional receiving device, shown in FIG. 5, has a photo-sensitive element portion with a different structure than that of the receiving device shown in FIG. 4. To be more specific, instead of P$^+$-type impurity region 20, N$^+$-type contact region 14' is formed in N-type epitaxial silicon layer region 34 of the photo-sensitive element surrounded by isolation diffusion layer 38. No N$^+$-type buried region 36 is formed in the photo-sensitive element portion. In FIG. 5, electrode 52 is formed on contact layer 38 while in FIG. 4 it is formed in ohmic contact with region 26. The peripheral circuit element portion of FIG. 5 is formed as in FIG. 4. FIG. 6 shows the impurity concentration profile of the photo-sensitive element portion. FIG. 7 shows an equivalent circuit for FIG. 4.

In the photo-sensitive element portion of the optical semiconductor device shown in FIG. 5, the junction between region 34 and substrate 32 is a P-N junction active as a photo-sensitive element. A depletion layer, indicated by the line 2 with alternate long and short dashes in FIG. 5, that is, to extend to the side of substrate 32 from an interface between region 34 and substrate 32. When a photo current is generated upon the incidence of light on the junction region, it is extracted at electrode 52 through layer 38, supplied to base region 50 of the NPN transistor through the interconnection layer 44, and amplified.

Depletion layer region 2 is formed in the receiving device shown in FIG. 5 on the side of substrate 32, so that thin substrate 32 can be used as a carrier generating region. However this device has poor response characteristics. When high response characteristics are required, as in optical fiber communication, it is preferable that the photo-sensitive element have as low a capacity as possible. For this reason, a silicon substrate having an impurity concentration of less than $10^{14}/cm^3$ (lower than the conventional IC having an impurity concentration of $10^{14}$ to $10^{16}/cm^3$) is used as substrate 32 shown in FIG. 5. In this case, width $W_1$ of layer 2 formed on the side of substrate 32 is calculated by the following equation (2) as $W_1 = 4$ μm under the assumption that saturation voltage Vcc is 5 V. Carriers are generated in layer 2 having a thickness of 4 μm.

$$W = \{(2k\epsilon_O/q)(N_A + N_D)/(N_A \cdot N_D)\phi_T\}^{\frac{1}{2}} \quad (2)$$

where
- k: vacuum dielectric constant;
- $\epsilon_O$: dielectric constant of Si;
- $\phi_T$: voltage applied to junction region;
- $N_A$: acceptor impurity concentration; and
- $N_D$: donor impurity concentration.

However, light incident in a region deeper than the region in layer 34 or region 2 in substrate 32 is absorbed thereat to generate carriers. The carriers generated in regions other than layer 2 reach the junction portion (the P-N junction portion between layers 34 and 32) only by the driving force of diffusion. The carriers are detected as a photo current after the carriers are generated in layer 2. Thus, the response characteristics of the photo-sensitive element deteriorate.

When $t_{VG} = 5$ μm, the transfer time $T_1$ of holes generated by layers 34 to reach the junction portion is $T_1 = 2 \times 10^{18}$, since diffusion constant $D_P$ is 13 cm$^2$/sec. A depth $d_1$, where 90% of the incident light having a wavelength of $\lambda = 800$ nm is absorbed in the silicon substrate, is calculated to be 25 μm using the above equation (1). Electron diffusion constant $D_N$ is 40 cm$^2$/sec. Thus, transfer time $T_2$ required for electrons generated in the P-type substrate region having depth $d_1$ (= 25 μm) to reach the junction portion is $6 \times 10^{-8}$. As a result, it is apparent that in the light-receiving circuit of FIG. 5 the diffusion current of the carriers generated deeper than region 2 in substrate 32 degrades the response characteristics of the photo-sensitive element.

SUMMARY OF THE INVENTION

It is an object of the present invention to provide an optical semiconductor device wherein a photo-sensitive element and a peripheral circuit element are integrated in a single chip to reduce manufacturing costs, increase the performance of the device, and improve the sensitivity and response characteristics of the photo-sensitive element without degrading the characteristics of the peripheral circuit element, and a method of manufacturing the same.

An optical semiconductor device according to the present invention comprises:

a first conductivity type semiconductor substrate;

a first conductivity type semiconductor layer formed on the first conductivity type semiconductor substrate and containing a dopant for regulating a first conductivity type, the first conductivity type semiconductor layer having in at least a portion thereof a dopant concentration profile decreasing with an increase in distance from the substrate;

an element formation layer formed on the first conductivity type semiconductor layer and having a second conductivity type semiconductor region, a first conductivity type high concentration diffusion region, a peripheral circuit element region, and a depletion layer formed in a junction region between the second conductivity type semiconductor region and the first conductivity type semiconductor layer, thereby producing carriers when light becomes incident on the depletion layer;

a first electrode formed in ohmic contact with the first conductivity type high concentration diffusion region;

a second electrode for ohmically contacting the second conductivity type semiconductor region; and an interconnection layer for electrically connecting the first or second electrode to the peripheral circuit element region.

According to the present invention, a depletion layer is formed in a junction region between a second conductivity type (e.g., N-type) semiconductor region and a first conductivity type (e.g., P-type) semiconductor layer. When light is incident on the depletion layer, carriers are produced. A concentration profile is formed in the first conductivity type semiconductor layer which decreases from the side of the substrate to the second conductivity type semiconductor region. Therefore, the dopant concentration in the junction of the first conductivity type semiconductor layer and the second conductivity type semiconductor region is low. The depletion layer is thus formed on the first conductivity type semiconductor layer near the junction. Since a thick first conductivity type layer (first conductivity type semiconductor layer) can be used as the carrier generating region, its light-receiving sensitivity is high. A concentration gradient is formed in the first conductivity semiconductor layer which decreases from the side of the substrate to the second conductivity semiconductor region. Therefore, carriers generated in the first conductivity semiconductor layer far from the junction are accelerated by a self-field or an internal potential gradient formed by the concentration gradient, and rapidly flow into the junction. As a result, in an optical semiconductor device of this type, carrier transfer time is shortened and high response characteristics are provided. Furthermore, in the present invention, a photo-sensitive element region which has high light sensing efficiency and high response and a peripheral circuit element region which has high response characteristics are integrated in a single chip, thereby decreasing manufacturing costs and improving the electrical performance of the optical semiconductor device.

An optical semiconductor device according to the present invention can be manufactured by a method comprising the steps of:

epitaxially growing a first conductivity type semiconductor layer on a first conductivity type semiconductor substrate containing a dopant for regulating a first conductivity type at a lower concentration than the dopant concentration of the substrate, so that a dopant concentration profile is formed in at least a portion of the first conductivity type semiconductor layer which decreases with an increase in distance from the substrate;

epitaxially growing a second conductivity type semiconductor layer on the first conductivity type semiconductor layer;

forming a first conductivity type high concentration diffusion layer on a region of the second conductivity type semiconductor layer and dividing the second conductivity type semiconductor layer into a photosensing element region and a peripheral circuit element region;

forming a peripheral circuit element in the peripheral circuit element region;

forming an insulating layer on the second conductivity type semiconductor layer, the insulating layer comprising holes formed by etching predetermined regions thereof; and forming an electrode to fill the hole and forming an interconnection layer on the insulating layer.

According to the manufacturing method of the present invention, a first semiconductor layer is epitaxially formed on the first conductivity type semiconductor substrate so that a dopant concentration profile can be easily formed. As a result, an optical semiconductor device having high sensitivity and good response characteristics can be easily manufactured.

BRIEF DESCRIPTION OF THE DRAWINGS

FIG. 11 is a schematic diagram of a device to be used in a response characteristics evaluation test;

FIGS. 12A, 12B and 12C show waveforms of the results of the response characteristics evaluation test;

DETAILED DESCRIPTION OF THE PREFERRED EMBODIMENTS

Figure 8:
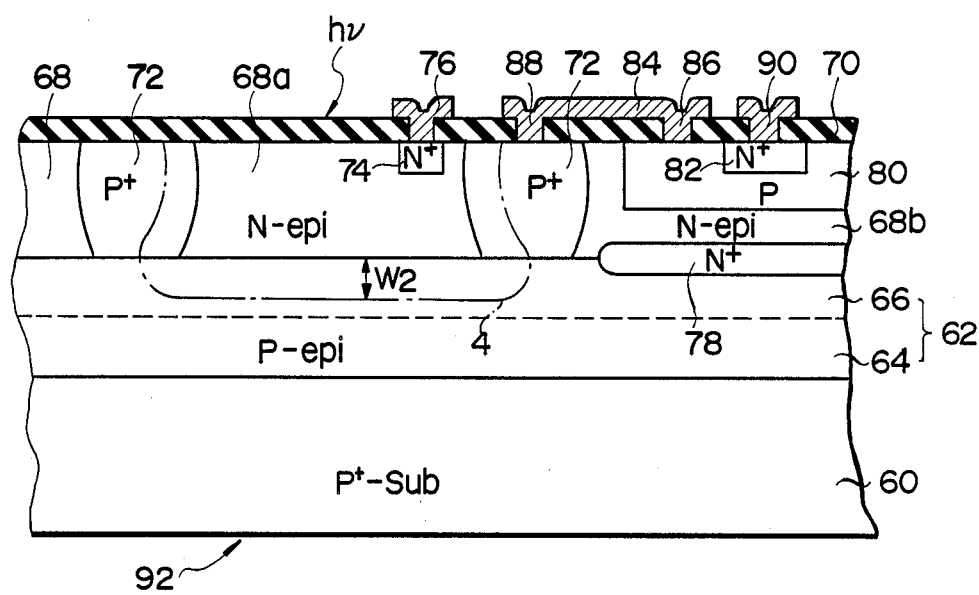
FIG. 8 is a sectional view of an optical semiconductor device according to an embodiment of the present invention.
Figure 9:
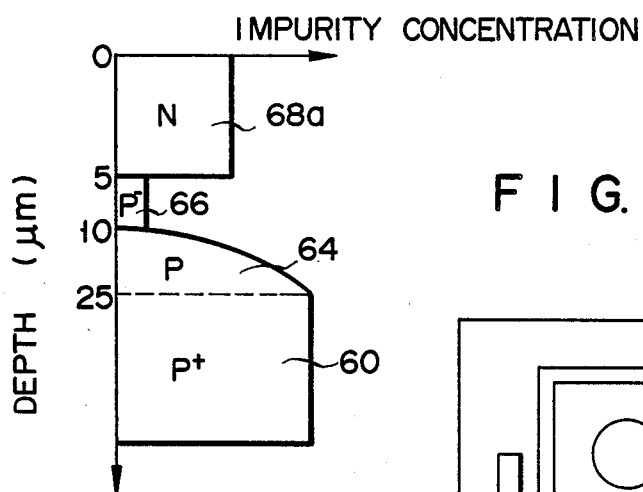
FIG. 9 is a view showing an impurity concentration profile of the same.

FIG. 8 is a sectional view of an optical semiconductor device according to an embodiment of the present invention. Substrate 60 is formed from a $P^+$-type silicon semiconductor having an impurity concentration of about $10^{19}/cm^3$. P-type epitaxial silicon layer 62 having a thickness of, e.g., 20 $\mu$m, is formed on substrate 60. Layer 62 has first layer 64, formed on substrate 60, and second layer 66, formed thereon. First layer 64 is an autodoped layer obtained by epitaxially growing a silicon semiconductor layer on substrate 60 so that the impurity in the substrate is diffused in the upper growing epitaxial layer. First layer 64 has a thickness of, e.g., 15 $\mu$m. As shown in FIG. 9, the impurity concentration of layer 64 decreases as it moves closer to layer 66. Layer 66 is a $P^-$-type epitaxial layer in which an impurity is lightly doped (to have an impurity concentration of, e.g., about $10^{14}/cm^3$).

N-type epitaxial silicon layer 68 having, e.g., a thickness of 5 $\mu$m and an impurity concentration of about $5 \times 10^{15}$ is formed on layer 62. Silicon oxide insulation layer 70 is formed on layer 68. Layer 68 is divided into a plurality of N-type epitaxial silicon regions 68a and 68b (of which only a pair is shown in FIG. 8) by $P^+$-type isolation diffusion regions 72 which connect layers 66 and 70 and are arranged with an appropriate space therebetween.

Region 68a is constituted as a photodiode element. In the photodiode element region, a P-N junction is formed between N-type expitaxial silicon region 68a and $P^-$-type epitaxial layer 66, which in turn forms an active region as the photodiode element. $N^+$-type contact region 74 is formed on a surface of region 68a on the side of layer 70. Region 74 is formed for connection with an electrode. A portion of layer 70 is left out to coincide with region 74. Aluminum electrode 76 is in the empty portion. Electrode 76 ohmically contacts region 74. $P^+$-type isolation diffusion layer 72 serves as an electrode connecting region for layer 66 constituting a part of the photodiode element.

Peripheral circuit elements such as a transistor and a resistor are formed on another region 68b. In this embodiment, an NPN transistor is formed in region 68b. $N^+$-type buried region 78 is formed in the peripheral circuit region in the boundary between layers 62 and 68 (region 68b). Region 78 acts to decrease the collector resistance. P-type base region 80 is formed in region 68b near layer 70. $N^+$-type emitter region 82 is formed in region 80 near layer 70. A portion of layer 70 is left out to coincide with regions 82 and 80. Aluminum electrodes are formed in the empty portions. Electrode 88, which ohmically contacts layer 72, and electrode 86, which ohmically contacts region 80, are connected by wiring 84. Electrode 90 ohmically contacts region 82. Semiconductor chip 92 having the structure defined above is then packaged in package 94 and connected to lead frame 96 with bonding wire.

Figure 1:
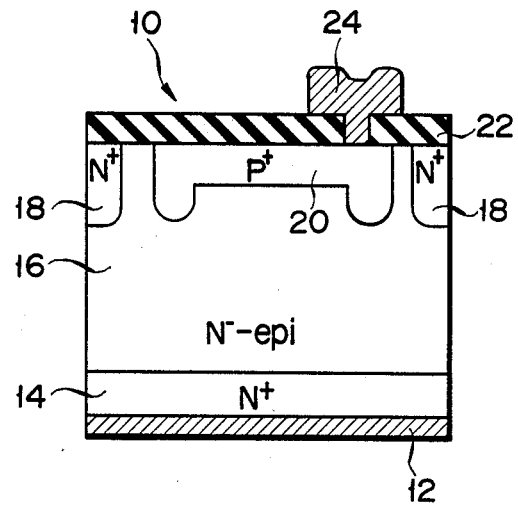
FIGS. 1, 2 and 3 are sectional views of conventional semiconductor photo-sensitive elements having hybrid structures.
Figure 2:
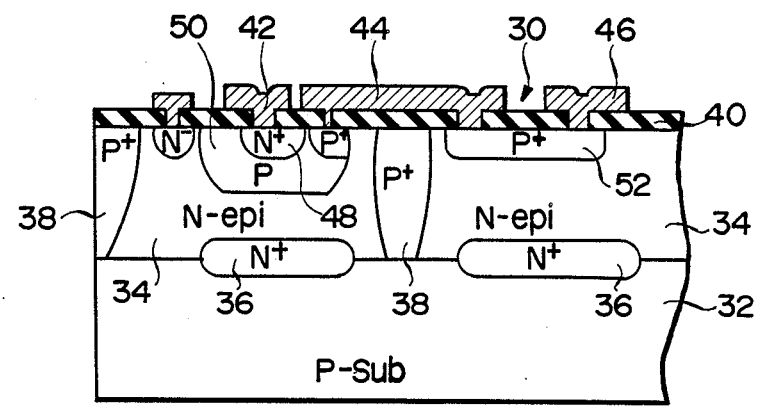
Figure 3:
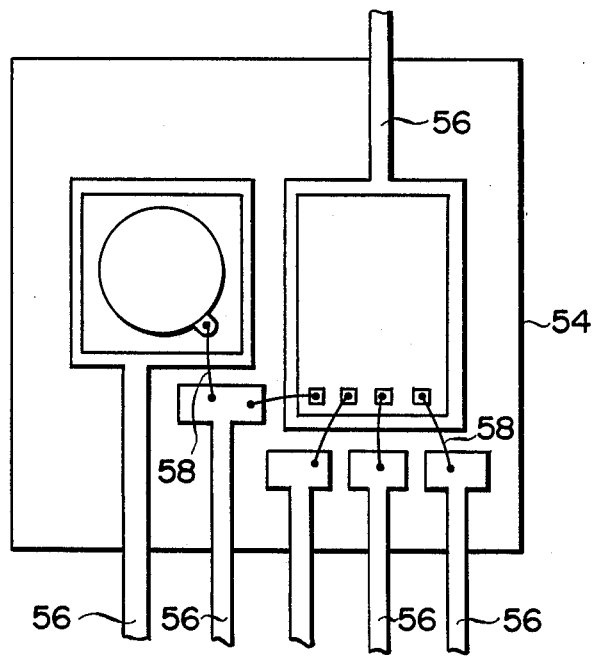
Figure 4:
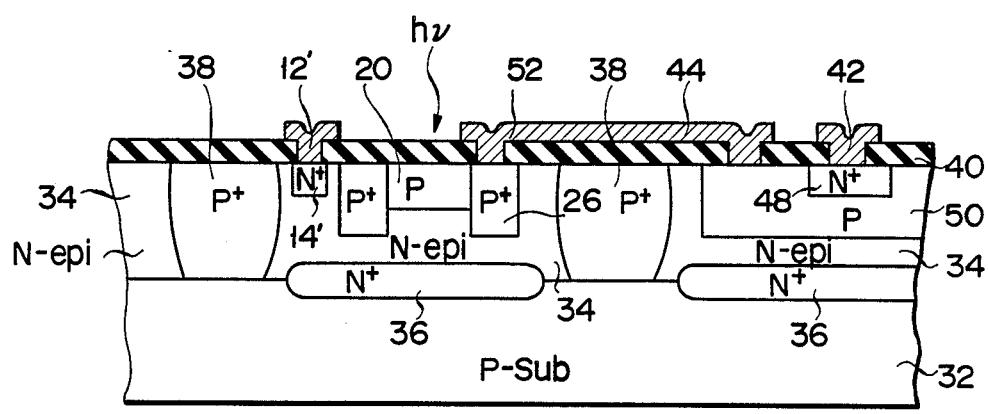
FIG. 4 is a sectional view of a conventional optical semiconductor device wherein a photo-sensitive element and a peripheral circuit element are integrated in one chip.
Figure 5:
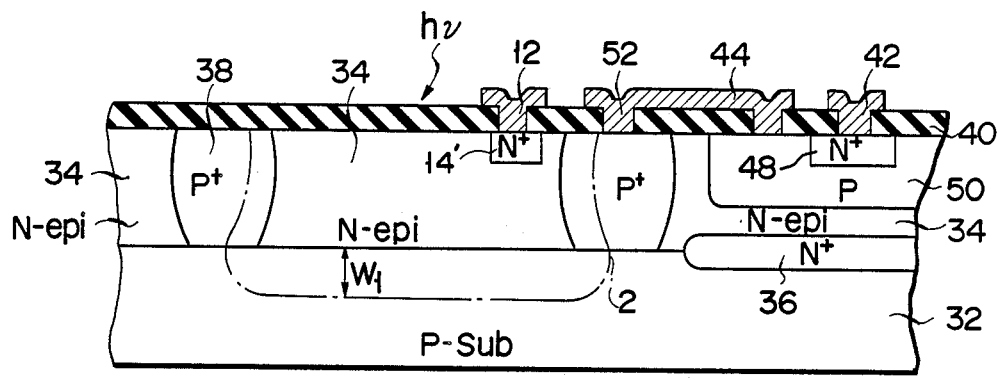
FIG. 5 is a sectional view of another conventional integrated optical semiconductor device.
Figure 6:
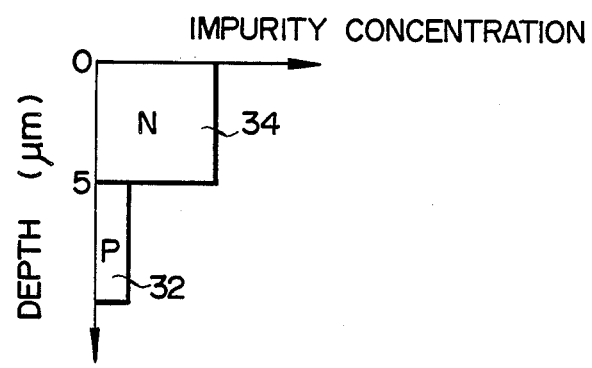
FIG. 6 is a view showing an impurity concentration profile of the same.
Figure 7:
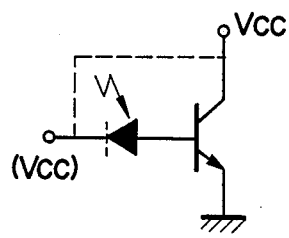
FIG. 7 shows an equivalent circuit of the same.

Comparison of FIGS. 8 and 5 reveals that the semiconductor chip of FIG. 8 has P-type epitaxial silicon layer 62, substrate 60 with a high impurity concentration, and an impurity concentration gradient in at least one region of layer 62. The semiconductor chip of FIG. 8 is thus different from a conventional semiconductor chip in these three respects. More specifically, as shown in FIG. 9, a concentration profile is formed in first layer 64 of layer 62 which decreases as it moves from substrate 60 toward layer 68. Note that the thickness and impurity concentration profile can be controlled with high precision if thermal conditions throughout the entire process (such as processing conditions in thermal oxidation and film forming conditions in epitaxy) are controlled so as to control autodoping.

In the embodiment described above, substrate 60 is a P+-type semiconductor in which an impurity is uniformly doped. This doping is done by autodoping to obtain the impurity concentration profile in first layer 64 of layer 62 shown in FIG. 9. Thus, impurities need not be doped at a high concentration in all regions of the silicon substrate. An impurity such as boron (B) may be implanted in a surface of the silicon substrate using ion implantation technique, or the impurity may be diffused to form a p+-type region on a surface layer of the silicon substrate. Then, an epitaxial layer may be grown on the side of the p+-type region.

The operation of the optical semiconductor according to the embodiment of the present invention will now be described. Voltage is applied across electrodes 76 and 88 to drive the photodiode element region with a reverse-bias voltage of 5 V. Then, as indicated by the line with alternate long and short dashes in FIG. 8, depletion layer region 4 is formed in the vicinity of the boundary between region 68a and layer 62. Region 4 has width $W_2$ of 4 µm so that it is formed within layer 66 and does not extend to region 64. In this manner, the conditions required for reducing response time by decreasing capacity are satisfied. Since region 4 is formed in layer 66 rather than in regions 68a, thick P-type layers (first layer 64 and second layer 66 of P-type epitaxial silicon layer 62) can be used as carrier generating regions which produces a main part of current. As a result, the sensitivity of the photodiode element is increased.

Meanwhile, assume that light having a wavelength of $\lambda = 800$ nm is incident on the photodiode element region of the optical semiconductor device according to the embodiment of the present invention. Since the light absorption ratio of region 68a and layer 62 (the total thickness of both is 25 µm) is about 90%, most of the incident light is absorbed therein. Light not absorbed therein is absorbed in substrate 60 and generates carriers. However, since substrate 60 has a comparatively high impurity concentration, the lifetime of carriers generated therein is extremely short, and the carriers do not influence the response characteristics of the photodiode element. Only carriers (electrons) generated in autodoped first layer 64 of layer 62 have the potential to degrade the response characteristics of the photodiode element. An impurity concentration profile as shown in FIG. 9 is formed in layer 64. Because of the concentration profile gradient, an internal potential or self-electric field is formed in layer 64 which extends toward the P-N junction region between region 68a and layer 66. Carriers generated in layer 64 are then accelerated by the self-electric field and rapidly flow into the P-N junction region. The carriers of the optical semiconductor device according to the embodiment of the present invention have a shorter travel time than those of the conventional optical semiconductor device shown in FIG. 5. Therefore, response characteristics of the embodiment of the present invention are considerably better than those of the conventional device.

Results of the response characteristics test of the optical semiconductor device according to the embodiment of the present invention will now be described.

Figure 10:
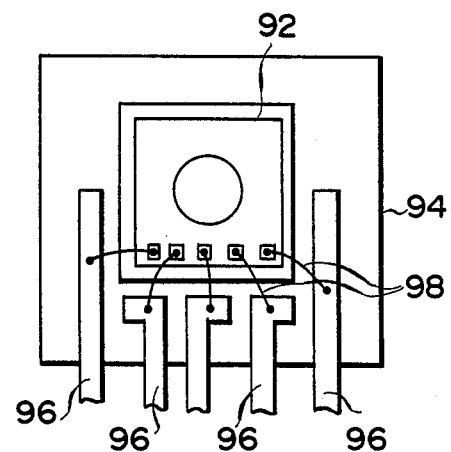
FIG. 10 is a plan view of a receiving device in which an optical semiconductor device according to the present invention is assembled.

Receiving circuit chip 92 for optical communication having the structure shown in FIG. 8 was assembled as shown in FIG. 10, packaged in package 94, and tested. Referring to FIG. 8, reference numeral 96 denotes a lead frame; and 98, a bonding wire. An optical signal having a rectangular waveform as shown in FIG. 11 was supplied from an LED light source to the receiving circuit shown in FIG. 8. The response characteristics were evaluated by means of the waveforms of output signal $V_{out}$ from the receiving circuit. Note that the response characteristics of the receiving circuit of FIG. 5 were tested in the same manner for comparison.

FIG. 12 shows the results of the test. FIG. 12A shows a signal waveform of incident light; FIG. 12B, an output signal waveform of the comparative example; and FIG. 12C, an output signal waveform of an embodiment of the present invention. As is apparent from FIGS. 12A, 12B, and 12C, a 30 nsec delay was observed in the comparative example from the leading edge of the waveform to a predetermined level. In the embodiment of the present invention, however, the delay was 10 nsec, one third that of the comparative example. This result demonstrates that the photodiode element of the optical receiving circuit device of the above embodiment has considerably improved response characteristics.

Note that layer 62 can be an autodoped layer with an impurity concentration gradient across the entire thickness thereof. In this case as well, considerable improvements in response characteristics can be obtained.

When a peripheral circuit is constituted solely by peripheral circuit elements, e.g., a MOS transistor and a diffusion resistor without a bipolar transistor, isolation diffusion layer 72 for element isolation is not needed. In this case, a P+-contact region can be formed solely for connection with an electrode from the P−-type epitaxial layer constituting the photodiode element.

Figure 13:
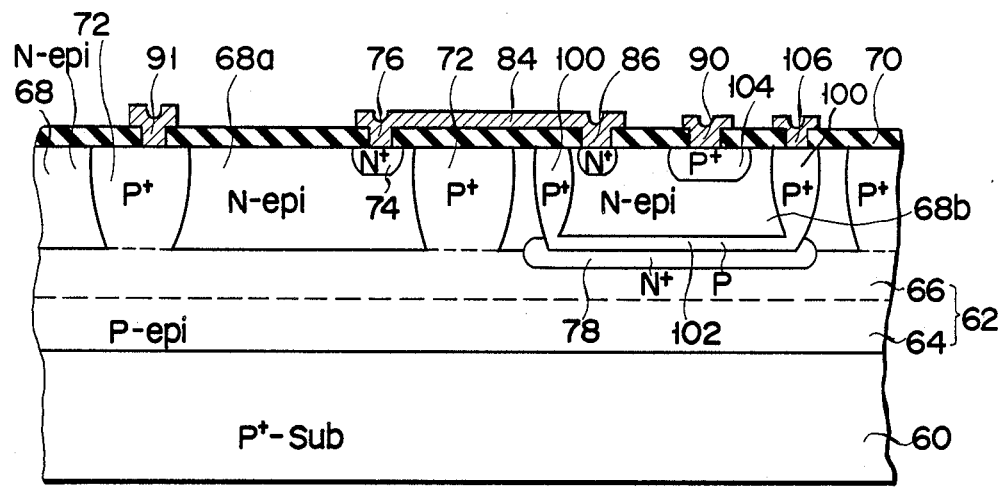
FIG. 13 is a sectional view of an optical semiconductor device according to another embodiment of the present invention.
Figure 14:
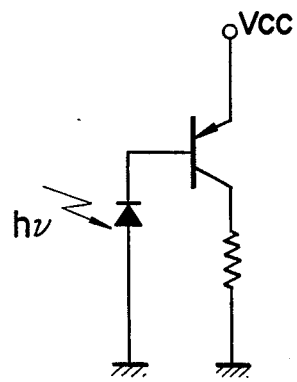
FIG. 14 shows an equivalent circuit of the same.

Another embodiment of the present invention is shown in FIG. 13. Here, a PNP transistor is used as the peripheral circuit element transistor. The structure of FIG. 13 is the same as that of FIG. 8 except for the PNP transistor. Therefore, the same reference numerals denote the same parts and detailed descriptions thereof are omitted. The PNP transistor has a P-type collector region formed on an N+-type buried region, P+-type collector deriving region 100 extending from an edge thereof to an upper surface of the structure, N-type epitaxial base region 68b on collector region 102 and surrounded by deriving region 100, P+-type emitter region 104 formed on a part of a surface of region 68b, collector electrode 106 connected to region 100, base electrode 84 connected to base region 68a, and an emitter electrode 90 connected to emitter region 104. Region 102 can be easily formed by predoping a P-type impurity such as boron in the surface thereof, and diffusing the doped impurity upward either when layer 68 is formed or afterwards. In the photodiode element region, anode electrode 91 is connected to anode deriving region 72 which also serves as a P+-type isolation diffusion layer. Anode electrode 91 is usually set at a grounding potential. In this case, base electrode 86 of the PNP transistor is connected to cathode electrode 76 through interconnection layer 84, which is formed in ohmic contact with region 74. Note that electrode 106 of the PNP transistor is grounded, and the emitter electrode 90 is connected to a power source potential ($V_{cc}$). An equivalent circuit corresponding to the structure of FIG. 13 can be seen in FIG. 14.

The embodiment of FIG. 13 has basically the same functions and operation as that of FIG. 8. From the viewpoint of electrical circuit connection, however, the anode of the photodiode is connected to the base of the NPN transistor in the embodiment of FIG. 8, whereas the cathode of the photodiode is connected to the base of the PNP transistor in the embodiment of FIG. 13. The embodiment of FIG. 13 is thus more suitable for using the substrate bias as a ground.

What is claimed is:

1. An optical semiconductor device comprising
a first conductivity type semiconductor substrate;
a first conductivity type semiconductor layer formed on said first conductivity type semiconductor substrate, said semiconductor layer having a first region of a dopant concentration increasing toward said substrate except for a second region formed in a surface region opposite said substrate which has a constant, low dopant concentration lower than that of said first region;
a second conductivity type element forming layer formed on said first conductivity type semiconductor layer to form a pn junction region therebetween, the element forming layer having a photosensitive element forming region, a second conductivity type semiconductor region formed in said photosensitive element forming region, a first conductivity type high concentration diffusion region formed to surround said photosensitive element forming region and extending from a surface of said element forming layer and into said element forming layer to reach said pn junction region, a peripheral circuit element forming region, and a depletion layer formed in said pn junction region between said second conductivity type semiconductor region and said first conductivity type semiconductor layer and extending substantially into said second region of said first conductivity type semiconductor layer, said first conductivity type semiconductor layer and said photosensitive element forming region of the element forming layer having a total thickness sufficient for both layers to absorb a substantial amount of light incident on the photosensitive element forming region of said element forming layer;
a first electrode formed in ohmic contact with said first conductivity type high concentration diffusion region;
a second electrode formed in ohmic contact with said second conductivity type semiconductor region; and
an interconnection layer for electrically connecting said first or second electrode to said peripheral circuit element forming region.

2. A device according to claim 1, wherein said interconnection layer connects said first electrode with an NPN transistor included in a peripheral circuit element formed in said peripheral circuit element forming region.

3. A device according to claim 1, wherein said interconnection layer connects said second electrode with a PNP transistor included in a peripheral circuit element formed in said peripheral circuit element forming region.

4. A device according to claim 1, wherein said first conductivity type semiconductor layer comprises a first region which is formed to cover one surface of said substrate and has a dopant concentration increasing toward said substrate, and a second region which is formed on said first region with a constant dopant concentration lower than that of said first region.

5. A device according to claim 1, wherein said first conductivity type diffusion region serves as an isolation diffusion region for isolating an element formed in said element forming layer.

6. A device according to claim 1, comprising an insulation layer formed on said element forming layer and a hole in said insulation layer formed by etching said insulation layer, said interconnection layer being formed on said insulation layer and one of said electrodes being buried in said hole.

7. A device according to claim 6, comprising a contact region formed in said second conductivity type semiconductor region and in ohmic contact with said second electrode and having a high concentration of dopant of a second conductivity type.

8. A device according to claim 1, wherein a dopant of the first conductivity type is uniformly included in said substrate in a high concentration.

9. A device according to claim 1, wherein a dopant of the first conductivity type is included at a side of said substrate in a high concentration, and said first conductivity type semiconductor layer is formed on a surface thereof.

10. A device according to claim 8, wherein said first conductivity type semiconductor layer is formed by epitaxially growing a first conductivity type semiconductor on said substrate.

* * * * *